U S 0 0 8 1 7 9 5 9 3 B 2

US008179593B2

(12) United States Patent
Noguchi et al.

(10) Patent No.: US 8,179,593 B2
(45) Date of Patent: May 15, 2012

(54) OPTICAL-SWITCH DRIVE CIRCUIT AND METHOD THEREOF

(75) Inventors: Masaji Noguchi, Kawasaki (JP); Yutaka Kai, Kawasaki (JP); Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 342 days.

(21) Appl. No.: 12/406,624

(22) Filed: Mar. 18, 2009

(65) Prior Publication Data

US 2009/0237127 A1 Sep. 24, 2009

(30) Foreign Application Priority Data

Mar. 19, 2008 (JP) .................................. 2008-71449

(51) Int. Cl.
*H01S 5/00* (2006.01)
*H03K 3/01* (2006.01)

(52) U.S. Cl. ........ 359/344; 327/103; 327/108; 327/109; 372/38.02; 372/38.07; 372/38.1

(58) Field of Classification Search .................. 359/344; 372/38.02, 38.07, 38.1; 327/108, 109
See application file for complete search history.

(56) References Cited

U.S. PATENT DOCUMENTS

| | | | | |
|---|---|---|---|---|
| 6,760,346 | B1 * | 7/2004 | Suemura et al. | 370/504 |
| 7,012,466 | B2 * | 3/2006 | Cerisola | 330/260 |
| 7,352,786 | B2 | 4/2008 | Ikeda | |
| 7,564,882 | B2 * | 7/2009 | Kim et al. | 372/38.1 |
| 2005/0213622 | A1 * | 9/2005 | Diaz | 372/38.02 |
| 2006/0023760 | A1 | 2/2006 | Kim et al. | |
| 2008/0068051 | A1 * | 3/2008 | Noguchi et al. | 327/111 |
| 2009/0058534 | A1 * | 3/2009 | Ueno et al. | 330/302 |

FOREIGN PATENT DOCUMENTS

| | | |
|---|---|---|
| JP | 2000-261504 | 9/2000 |
| JP | 2000-261508 | 9/2000 |
| JP | 2001-154160 | 6/2001 |
| JP | 2002-335038 | 11/2002 |
| JP | 2005-208178 | 8/2005 |

OTHER PUBLICATIONS

Yamada, "Hybrid-Integrated 4×4 Optical gate matrix switch using silica-based optical waveguides and LD array chips", Journal of Lightwave Technology, vol. 10, No. 3, pp. 383-390 (1992).*
Gallep, C.M. et al "Calibration of semiconductor optical amplifier simulator for switching action prediction", Microwave and Optoelectronics Conference, 2003, Proceedings of the 2003 SBMO/IEEE MTT-S International, vol. 1, pp. 129-132, Sep. 2003.*

* cited by examiner

*Primary Examiner* — Eric Bolda
(74) *Attorney, Agent, or Firm* — Staas & Halsey LLP

(57) ABSTRACT

An optical-switch drive circuit including a driver unit that generates, in response to a control signal, an on/off signal for driving a semiconductor optical amplifier gate switch, and a buffer unit having a high input impedance and connected between an output terminal outputting the on/off signal and the semiconductor optical amplifier gate switch. In the optical-switch drive circuit the buffer unit may include a high-resistance voltage divider that is connected with the output terminal, and an operational amplifier that buffers, and provides to the semiconductor optical amplifier gate switch, a divided voltage of the voltage divider.

1 Claim, 18 Drawing Sheets

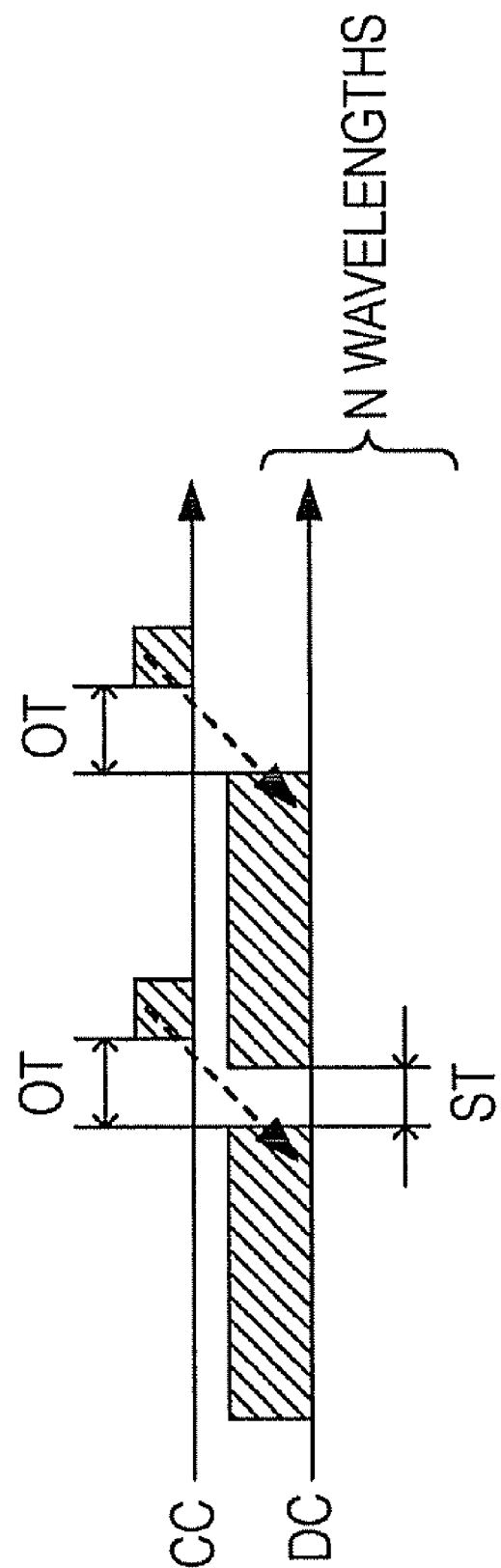

OPTICAL-SWITCH DRIVE CIRCUIT AND METHOD THEREOF

CROSS-REFERENCE TO RELATED APPLICATIONS

The application is based upon and claims the benefit of priority of the prior Japanese Patent Application No. 2008-071449, filed on Mar. 19, 2008, the entire contents of which are incorporated herein by reference.

BACKGROUND

1. Field

The present invention relates to an optical-switch drive circuit and may be applied to a drive circuit including for a semiconductor optical amplifier (SOA) gate switch that is used in a matrix optical switch unit of an optical packet switching system in an optical communication network.

2. Description of the Related Art

High-speed large-capacity optical communication apparatuses are required for future multimedia networks. As a system for realizing such a high-speed and large-capacity system, research and development has been in progress regarding an optical packet switching system that uses high-speed optical switches functioning in nanoseconds.

An SOA gate switch is a device that can switch in nanoseconds, and is expected to be applied to an optical packet switching system.

FIG. 9A illustrates a general optical packet switching network, FIG. 9B illustrates a configuration of an edge node EN, and FIG. 9C illustrates a configuration of a core node CN. The optical packet switching network includes a plurality of core nodes CNs which are connected to edge nodes ENs via an optical access network ANW. Each node is connected by data channels DC and a control channel CC.

The core node CN, which is illustrated in FIG. 9C, has a matrix optical-switch function for switching optical packet signals. Optical packet data from the data channels DC, after its wavelength is converted by a wavelength converter WC, is provided to a matrix optical switch MSW.

In the control channel CC, routing information of an optical packet signal is relayed as a label signal between nodes via an optical-electrical (electrical-optical) converter CNV. A reservation manager RM analyzes the routing information of the label and controls the matrix optical switch MSW. Hence the route of optical packet data, whose wavelength has been converted by the wavelength converter CNV, is switched by the matrix optical switch MSW, under the control of the reservation manager RM.

FIG. 10 is a diagram illustrating timings of the switching. In the matrix optical switch MSW, route switching is performed at a predetermined offset time, (OT in FIG. 10) after receiving the label signal having the routing information of the control channel CC. The switching time (ST in FIG. 10) of the optical switch is about 10 ns, which is a guard period that prevents an optical packet signal from being affected. In other words, the switching of an optical packet signal needs to be completed during the guard period.

FIG. 11 illustrates an example configuration of the matrix optical switch MSW, which is a distributive optical switch using SOA gate switches.

First, optical packet signals PKT#1, PKT#2, PKT#3, etc, each of which has a specified output destination as illustrated in FIG. 11, are received at input ports Pi#1 to Pi#n. In FIG. 11, packets having the same packet number from different originating ports are identified by diagonal or dotted shading. The input packets received at the input ports Pi#1 to Pi#n, undergo distribution by optical couplers DCLs and then desired optical-packet-signal route switching that is realized by high-speed selection based on on/off states of SOA gate switches GSWs. Output packets from the SOA gate switches GSWs, which are controlled by the reservation manager RM, are merged by optical merging couplers CPLs that perform merging of optical packet signals, and are output from desired ports among the ports Po#1 to Po#n.

For instance, an optical packet signal PKT#n having a destination of the output port Po#n, input at the input port Pi#1, is branched in parallel into n signals by the optical coupler DCL. The optical signals, after 1-to-n branching, are input to the SOA gate switches GSWs provided for respective output ports Po#1 to Po#n. Since the optical packet signal is to be output to the output port Po#n in the case, only the SOA gate switches GSWs provided for the output port Po#n are turned on by the control signal from the reservation manager RM. All the SOA gate switches GSWs provided for other output ports are kept in the off state.

FIG. 12 illustrates an example operation of the SOA gate switch GSW, and FIG. 13 illustrates an example configuration for driving the SOA gate switch GSW. The SOA gate switch GSW is a device that can amplify an optical signal propagating through an optical-signal amplification region ROA by injecting a current into the optical-signal amplification region ROA. The SOA gate switch GSW is used as a gating element for an optical signal, operating by on/off control of its drive current $I_{GSW}$.

The example illustrated in FIG. 12 corresponds to a state where, for the input optical packet signals PKT#1, PKT#2, and PKT#3, drive circuit control is performed such that the gate is on for the packets PKT#1 and PKT#3, and the gate is off for the packet PKT#2.

For the control, the SOA gate switch GSW is controlled by a control signal CONT from the reservation manager RM via an optical-switch drive circuit 1 as illustrated in FIG. 13.

FIG. 14 illustrates optical gain versus drive current $I_{GSW}$ for the SOA gate switch GSW. The SOA gate switch GSW, a semiconductor optical amplifier, has a characteristic in which its optical gain varies with the drive current $I_{GSW}$. Referring to FIG. 14, the optical gain becomes approximately 10 dB at a flowing drive current of approximately 300 mA, where the gain is nearly saturated (the on state). As the drive current $I_{GSW}$ decreases, the gain decreases, illustrating a characteristic of attenuation, and becomes approximately −60 dB in the off state.

FIG. 15 illustrates optical gain versus drive voltage $V_{GSW}$ for the SOA gate switch GSW. Although the SOA gate switch GSW is a current driven switch, it can be used as a voltage driven switch by applying a voltage using a voltage source having a current capacity of 300 mA or more. In the example, the optical gain is 10 dB at a voltage of approximately 1.5 V, entering the on state with a drive current of approximately 300 mA as can be seen from FIG. 14. As the drive voltage decreases, the gain decreases, illustrating the characteristic of attenuation, and also becomes approximately −60 dB in the off state.

FIG. 16 illustrates the drive voltage $V_{GSW}$ of the SOA gate switch GSW versus the inter-SOA-gate-switch extinction ratio (on/off ratio).

Each of the optical merging couplers CPLs at the output of the matrix optical switch MSW illustrated in FIG. 11 is provided with the SOA gate switches GSWs in a number equal to the input ports of the matrix optical switch MSW. When a certain SOA gate switch GSW is on, all the rest of the SOA gate switches GSWs are in the off state. However, there is leakage of light even in the off state, causing crosstalk of light in the optical merging coupler CPL.

FIG. 16 illustrates the crosstalk as an extinction ratio characteristic. When an 8-by-8 matrix optical switch is to be configured, approximately 58 dB is required as an extinction ratio characteristic corresponding to on and off states. To obtain the extinction ratio characteristic, the drive voltage $V_{GSW}$ must be set to 0.65 V or less.

FIG. 17 illustrates a drive circuit 1a for an SOA gate switch, according to a typical technology.

Referring to FIG. 17, a parasitic inductance L1 within a connection line between the SOA gate switch GSW and the drive circuit 1a is a parasitic inductance component that is generated when a high frequency signal passes through a substrate pattern of the drive circuit 1a. A parasitic inductance L2 is a parasitic inductance component that is generated when a high frequency signal passes through a transmission line within a module MDL in which the SOA gate switch GSW is housed. A diode D1 connected in parallel with the SOA gate switch GSW is a Schottky diode.

The drive circuit 1a has high-speed operational amplifiers OP1 to OP3. The operational amplifier OP1 has an output current capacity of 300 mA, and has the following performance: a bandwidth of approximately 1 GHz, a slew rate of approximately 5000 V/μs, and a settling time of approximately 2 ns. A power source having a DC voltage $V_{SET1}$ of 0.825 V is connected to a non-inverting input terminal of the operational amplifier OP1. The voltage $V_{SET1}$ is amplified to a voltage $V_{SET2}$ of 1.65 V by the high-speed operational amplifier OP1 that has a gain (1+R2/R1) of two using resistors R1 and R2.

The drain terminal D of a high-speed field effect transistor FET1 is connected to the output terminal of the operational amplifier OP1. The source terminal S of the transistor FET1 is connected to the drain terminal D of a transistor FET2, whose source terminal S is connected to the ground.

A connection node between the transistors FET1 and FET2 is connected to the SOA gate switch GSW via the parasitic inductance L1 of a transmission line of the substrate and the parasitic inductance L2 of a transmission line within the SOA gate switch module MDL. The high-speed Schottky diode D1 is a diode used for suppressing ringing when the SOA gate switch GSW is turned off.

CONT in FIG. 17 denotes a control signal for switching the SOA gate switch GSW on/off. The control signal CONT is supplied via a buffer BUF1 to an inverter INV and a buffer BUF2 (buffer having a delay characteristic equivalent to that of the inverter INV). The operational amplifiers OP2 and OP3 are respectively connected to the buffer BUF2 and the inverter INV. The operational amplifiers OP2 and OP3 are high-speed driving amplifiers used for respectively driving the transistors FET1 and FET2. The operational amplifiers OP2 and OP3 have a performance similar to that of the operational amplifier OP1, i.e., they correspond to the operational amplifier OP1 whose gain is set to "1".

The control signal CONT, when it is set to a high level "1", will cause the transistor FET1 to turn on and the transistor FET2 to turn off via the buffer BUF2 and the operational amplifier OP2. Hence the output voltage $V_{SET2}$ of the operational amplifier OP1 is applied to the SOA gate switch GSW via the transistor FET1 and the parasitic inductances L1 and L2. The transistor FET1, which has an internal resistance of 0.5 Ω, will have a voltage drop of 0.15 V when a current of 300 mA is passed therethrough. Hence, the voltage $V_{OUT}$ of the connection node between the transistors FET1 and FET2, i.e., an input voltage of the SOA gate switch GSW, is set to 1.5V(=1.65V−0.15V).

On the other hand, to turn the SOA gate switch GSW off, the control signal CONT is set to a low level "0". By the control, the transistor FET1 is turned off, the transistor FET2 is turned on, the input voltage $V_{OUT}$ is set to the ground level, and a current stops flowing in the SOA gate switch GSW, which is the off state.

As a typical technology, for example, Japanese Unexamined Patent Application Publication No. 2002-335038 discusses a light-emitting-device driving apparatus and a light-emitting-device driving system, where light emitting devices in a surface-emitting laser system are driven such that, while each light emitting device is made to be in a forward-biased state, either a bias voltage lower than a lasing threshold voltage or a drive voltage above or equal to the lasing threshold voltage is applied, through appropriately switching, directly to the drive terminal of the light emitting device.

FIG. 18 illustrates operation waveforms that exist during the driving operation of an SOA gate switch of the typical technology illustrated in FIG. 17. Referring to FIG. 18, $V_{OUT}$ is a source voltage waveform of the transistor FET1, $V_{GSW}$ is an anode voltage waveform of the SOA gate switch GSW, and $I_{GSW}$ is a current waveform of the SOA gate switch GSW. In the waveforms illustrated in FIG. 18, ringing at the rising edge of the voltage $V_{OUT}$ appears also in the waveform of the current $I_{GSW}$ of the SOA gate switch GSW. Ringing, also generated in the optical output of the SOA gate switch GSW, will cause an optical surge and, therefore, may cause an optical receiver to deteriorate. This is due to the following reason. Since the operational amplifiers OP1 to OP3 operate in nanoseconds, a resistor component R of the transistor FET1 and parasitic inductances L1 and L2 form an L-R circuit, and its transient phenomenon causes the rising waveform of the voltage $V_{OUT}$ to become less steep.

The ringing, which becomes a noise in a main signal superimposed on light, may cause an error. Furthermore, it takes approximately 15 ns for the ringing of the current $I_{GSW}$ to settle, leading to a slow rise time of the waveform. In addition, assuming an internal resistance of the transistor FET1 to be 0.5 Ω, a power of approximately 45 mW is consumed at 300 mA. Since a large drive current is used, the power consumption within the transistor FET1 will markedly increase as the internal resistance of the transistor FET1 used increases.

The falling edge of the waveform of the current $I_{GSW}$ also has a ringing portion of about 1.5 ns, since charge accumulated in the junction capacitance (approximately 70 pF) is discharged; however, the optical signal is not affected, since the extinction ratio of the SOA gate switch GSW is 58 dB or more when the voltage $V_{GSW}$ becomes lower than 0.65 V.

Note that a rise time is a time from a start point at which the voltage applied to the SOA gate switch GSW is 0.65 V, which satisfies the extinction ratio characteristic, until an end point at which a current flowing in the SOA gate switch GSW reaches 90% of the steady state value of 300 mA, namely approximately 270 mA. A fall time is a time from a start point at which a current flowing in the SOA gate switch GSW decreases to 90% of the steady state value of 300 mA, namely approximately 270 mA, until an end point at which the voltage applied to the SOA gate switch GSW falls to 0.65 V, which satisfies the extinction ratio characteristic.

SUMMARY

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 10 is a schematic diagram illustrating timings of a switching;

DETAILED DESCRIPTION OF EMBODIMENTS

Figure 1:
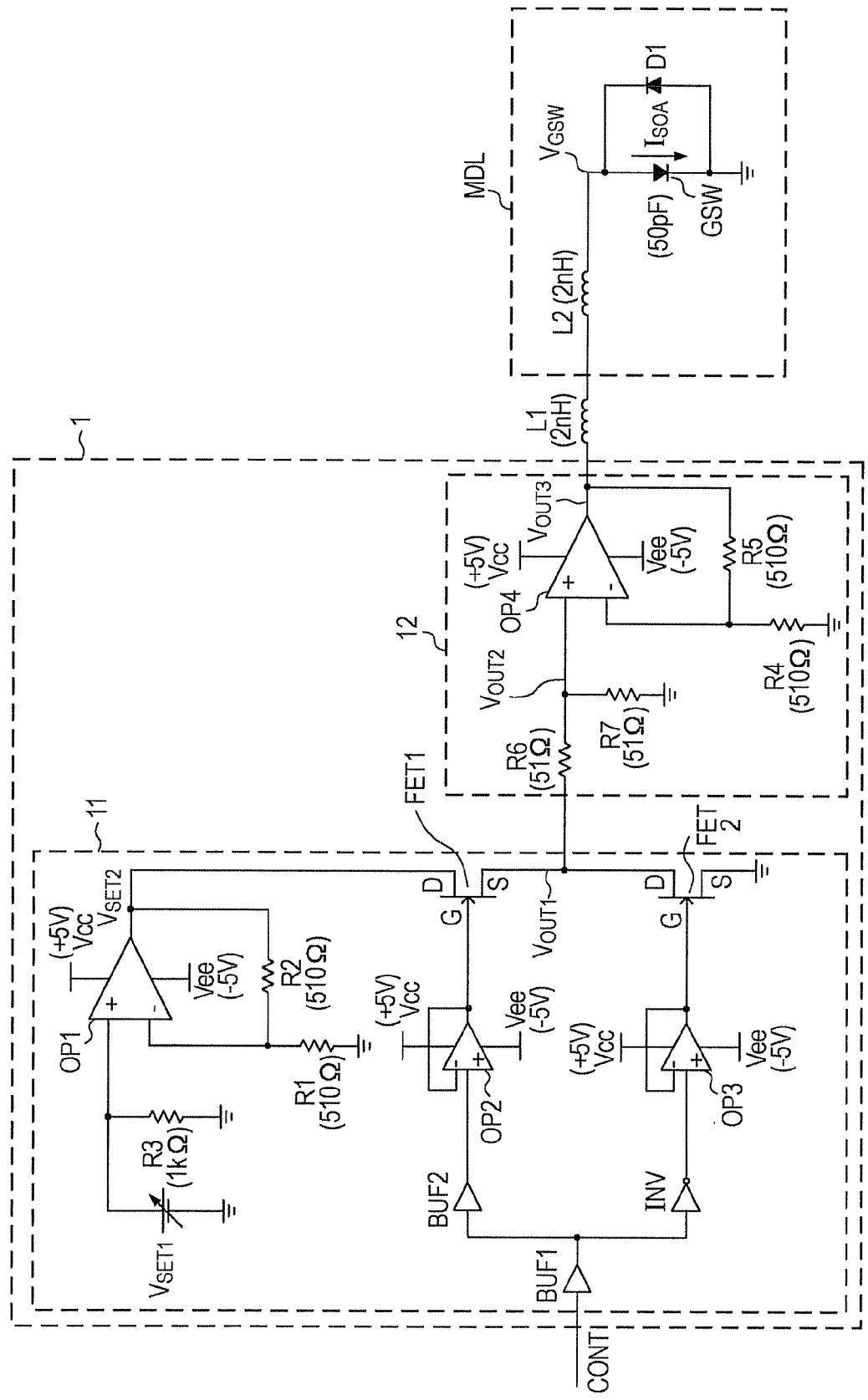
FIG. 1 is a circuit diagram illustrating an embodiment of an SOA gate switch and a drive circuit.

Reference will now be made in detail to the embodiments, examples of which are illustrated in the accompanying drawings, wherein like reference numerals refer to the like elements throughout. The embodiments are described below to explain the present invention by referring to the figures.

FIG. 1 illustrates an embodiment of a drive circuit of an SOA gate switch. In the drive circuit 1 of an embodiment, an operational amplifier OP4 and resistors R4 to R7 are provided between a connection node of transistors FET1 and FET12, and parasitic inductance L1. The resistors R4 and R5 operate similar to the resistors R1 and R2 of the operational amplifier OP1; however, resistors R6 (51 Ω) and R7 (51 Ω) connected with the non-inverting terminal of the operational amplifier OP4 form a voltage divider of the source voltage $V_{OUT1}$ of the transistor FET1. The high-speed operational amplifier OP4, similar to the operational amplifier OP1, has an output current capacity of 300 mA and the following performance: a bandwidth of approximately 1 GHz, a slew rate of approximately 5000 V/μs, and a settling time of approximately 2 ns.

Figure 2:
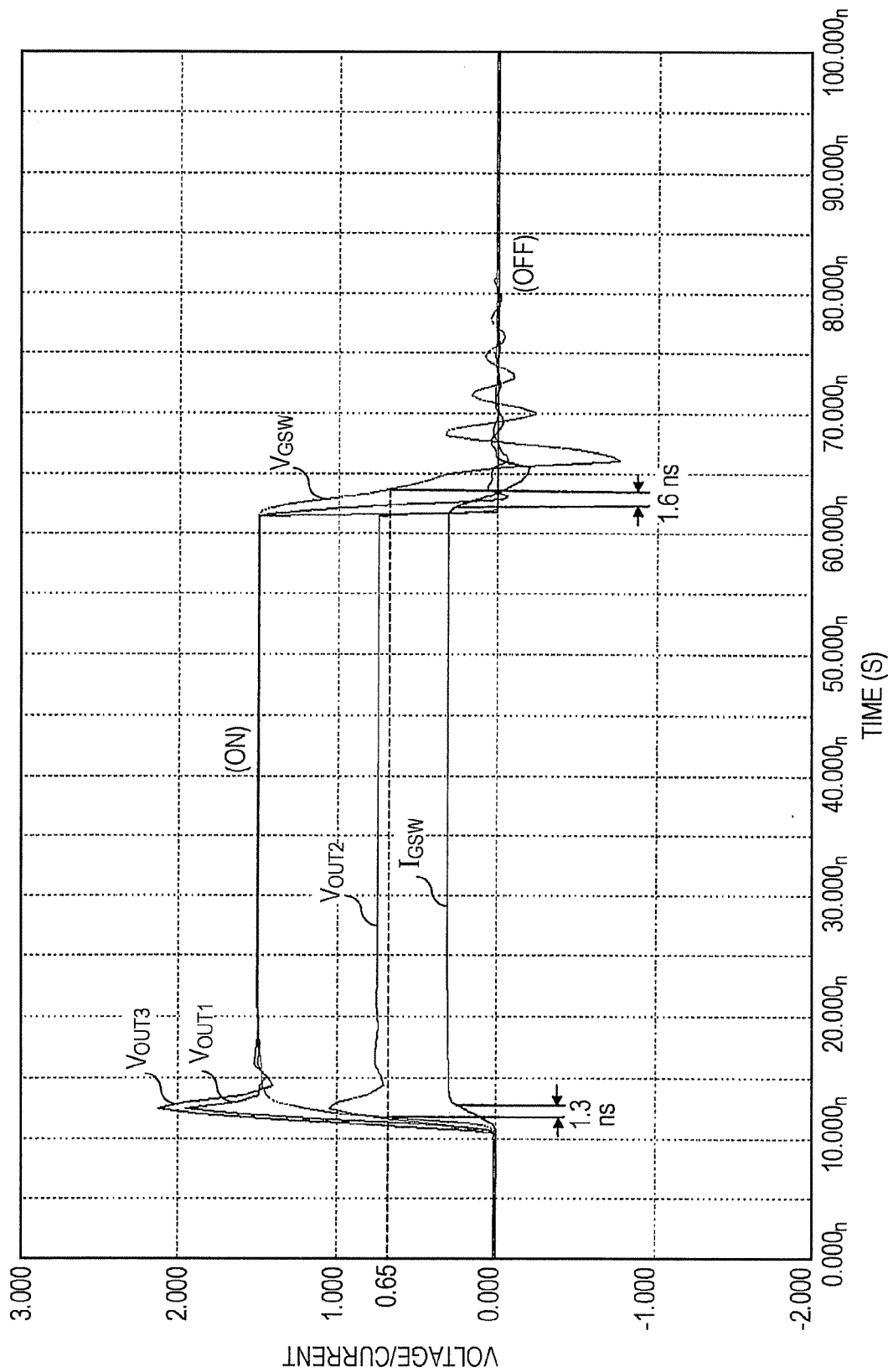
FIG. 2 is a graph illustrating operation waveforms of an embodiment.

FIG. 2 is a graph illustrating operation waveforms of an embodiment. Referring to FIG. 2, $V_{OUT1}$ is a voltage waveform at a connection node of the transistors FET1 and FET2, $V_{OUT2}$ is a divided voltage of the resistors R6 and R7, i.e., an input voltage waveform of the operational amplifier OP4, $V_{OUT3}$ is an output voltage waveform of the operational amplifier OP4, $V_{GSW}$ is an anode voltage waveform of the SOA gate switch GSW, and $I_{GSW}$ is a current waveform of the SOA gate switch GSW.

Figure 17:
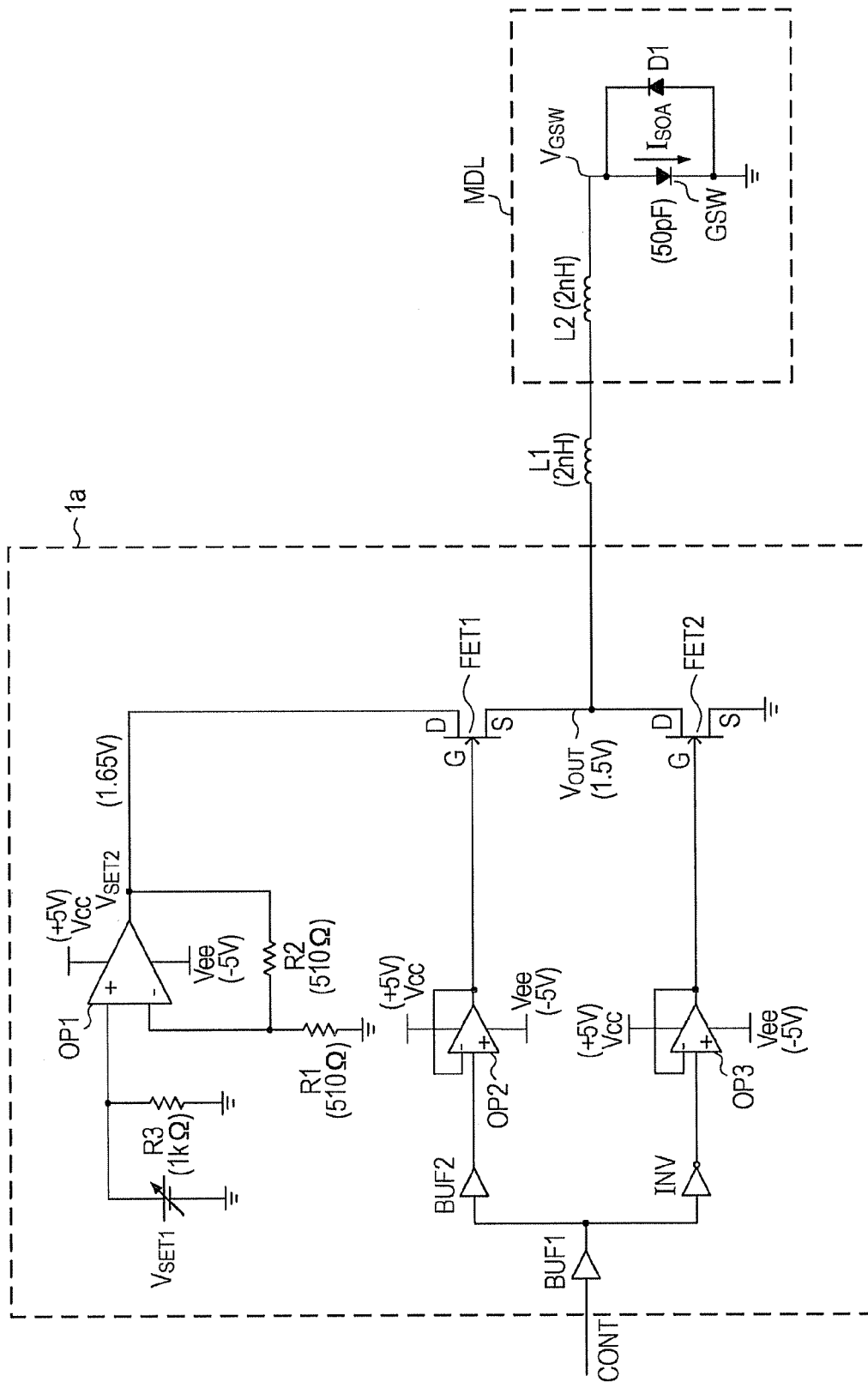
FIG. 17 is circuit diagram illustrating an example of an SOA gate switch and a drive circuit according to a typical technology.

In operation, when the transistor FET1 is turned on and the transistor FET2 is turned off, the divided voltage $V_{OUT2}$ at the connection node of the resistors R6 and R7 becomes 0.75 V, assuming parameter values similar to those illustrated in FIG. 17. In the case, even when an internal resistance of approximately 0.5 Ω exists in the transistor FET1, the internal resistance is as small as approximately 1/200 of the composite resistance of the resistors R6 and R7, and hence a voltage drop in the transistor FET1 is negligible.

The divided voltage $V_{OUT2}$ given by the resistors R6 and R7 is doubled by the operational amplifier OP4, similarly to the operational amplifier OP1, to produce the output voltage $V_{OUT3}$ of 1.5 V. The output voltage $V_{OUT3}$ is applied to the SOA gate switch GSW via the parasitic inductance L1 of a transmission line of the substrate and the parasitic inductance L2 of a transmission line within the SOA gate switch module MDL.

When the control signal CONT is set to a high level, the transistor FET1 is turned on and the transistor FET2 is turned off. Hence the output voltage $V_{SET2}$ of the operational amplifier OP1 is applied to the SOA gate switch GSW via the transistor FET1, the voltage divider constituted by the resistors R6 and R7, the operational amplifier OP4, and the parasitic inductances L1 and L2, thus making the SOA gate switch GSW turn on.

To turn the SOA gate switch GSW off, the control signal CONT is set to a low level. By the procedure, the transistor FET1 is turned off, and the transistor FET2 is turned on. At the time, the voltage $V_{OUT1}$ is set to the ground level, and a current stops flowing in the SOA gate switch GSW, which is the off state.

Figure 18:
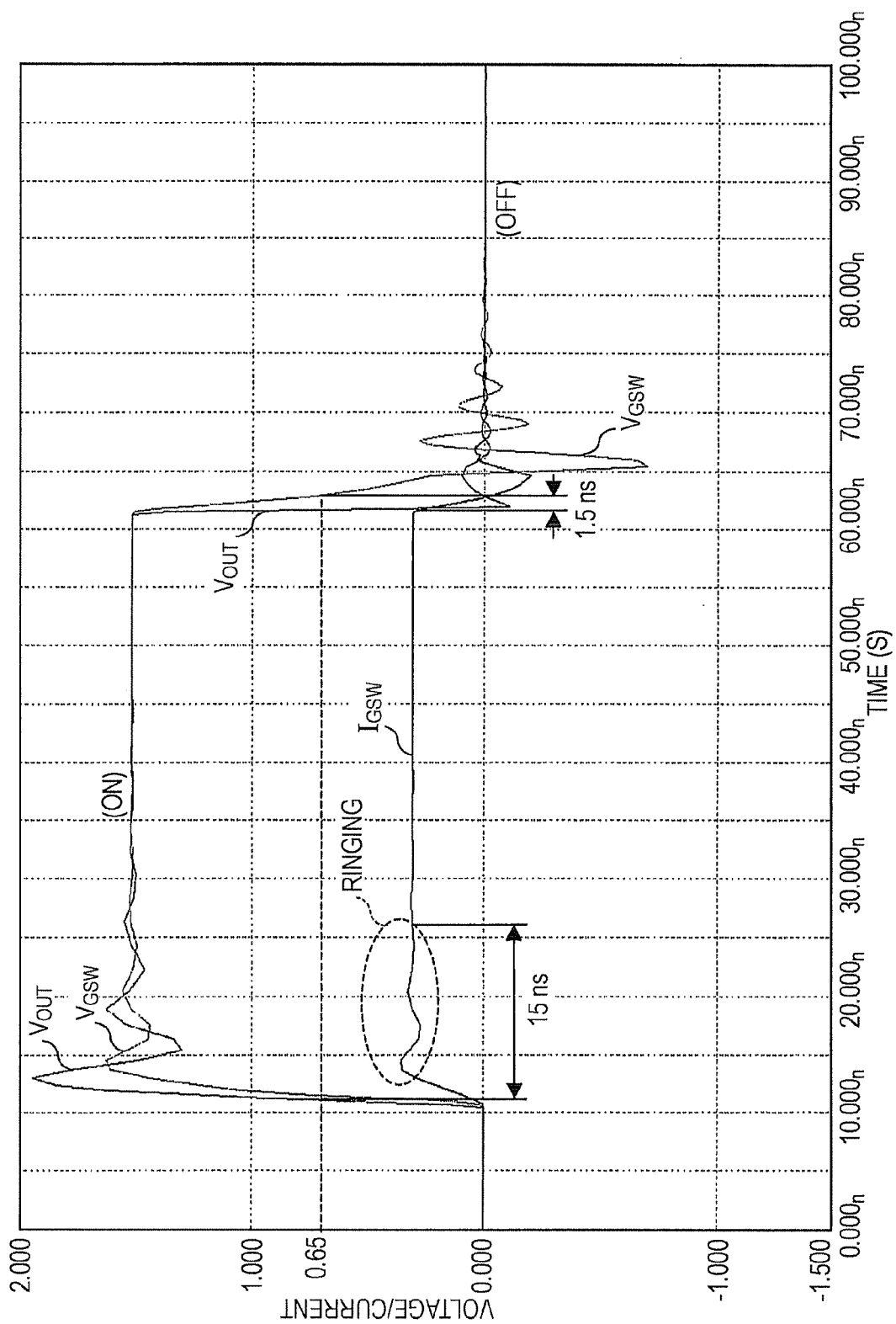
FIG. 18 is a graph illustrating operation waveforms of the typical technology illustrated in FIG. 17.

FIG. 2 illustrates operation waveforms during the driving operation of the SOA gate switch GSW. The waveform of the voltage $V_{OUT1}$ illustrated in FIG. 2 illustrates a fast rise time and a stable operation, compared with the waveform of $V_{OUT}$ illustrated in FIG. 18 corresponding to the typical technology.

This is because the load of the drive circuit 1 in an embodiment is the voltage divider whereas the load of the drive circuit 1a in the typical technology is the SOA gate switch GSW. The voltage divider in an embodiment is made up of the resistors R6 (51 Ω) and R7 (51 Ω), that has a resistance as high as 102 Ω. The general SOA gate switch GSW according to an embodiment includes the parasitic inductances L1 and L2 and thus has its own parasitic capacitance.

In other words, the high resistance component causes $V_{OUT1}$ to have a large reflected-wave component, and therefore, an overshoot. The emphasis component has an advantage of increasing the speed and bandwidth of the operational amplifier OP4, causing the output of the operational amplifier OP4 to also have an emphasized waveform. The emphasized waveform is sufficiently short compared with the time constant (approximately 3 ns) of a circuit that is constituted by the parasitic inductances L1 and L2 and the internal resistance component of the SOA gate switch GSW. Hence, the emphasized waveform allows the voltage and current of the SOA gate switch GSW to advantageously have waveforms corresponding to increased speed. As a result, the ringing at the rising edge, as observed in the existing technology, is suppressed to 1.3 ns.

Note that, in a high-speed buffer unit 12 of the embodiment described above, the voltage divider constituted by the resistors R6 and R7 also performs high-frequency impedance matching, assuming that the substrate pattern between the output terminal of a high-speed driver unit 11 and the operational amplifier OP4 has a certain length. When the length of the substrate pattern is small, the impedance matching is not required. Hence, the voltage divider is not required, because the operational amplifier OP4 has high input impedance itself.

Figure 3:
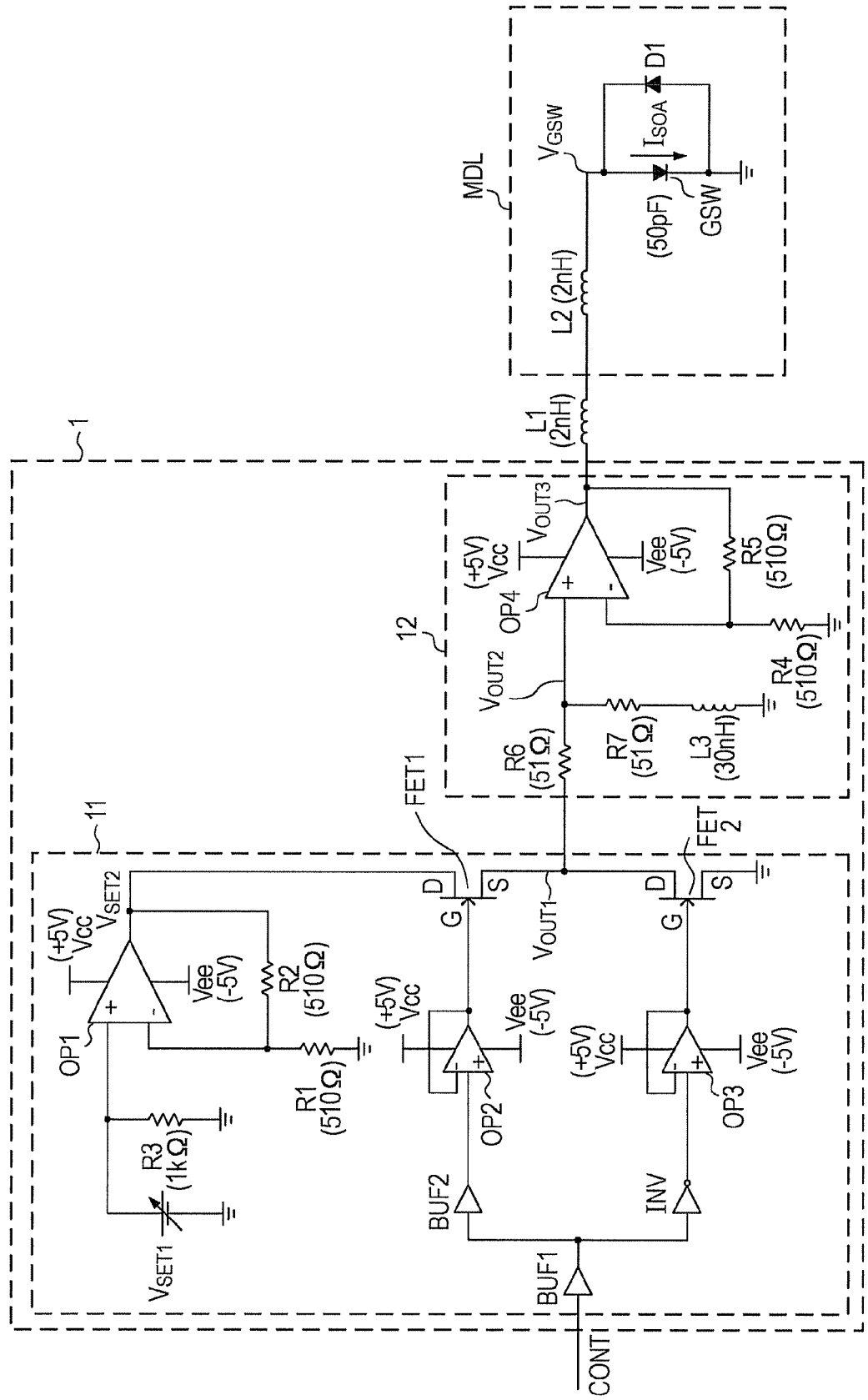
FIG. 3 is a circuit diagram illustrating an embodiment of an SOA gate switch and a drive circuit.

FIG. 3 illustrates another embodiment of a drive circuit of the SOA gate switch GSW. This embodiment, different from the above-described embodiment, has an inductor L3 (30 nH) that is connected between the resistor R7 and the ground, in the voltage divider constituted by the resistors R6 and R7.

In this embodiment A, when the voltage $V_{OUT1}$ is divided by the resistors R6 and R7 to produce the voltage $V_{OUT2}$, the high-frequency component (rising edge) of the square-wave voltage $V_{OUT2}$ that is applied to the inductor L3 will have a waveform that is emphasized by a counter electromotive force generated by the inductor L3.

By amplifying the signal with the operational amplifier OP4, the output voltage $V_{OUT3}$ is also emphasized. Hence, the load (SOA gate switch GSW) connected to the output $V_{OUT3}$ can be driven such that a delay in the waveform due to the influence of a transmission line along the path to the load or the influence of the time constant of the load is minimized.

The configuration and the procedure will allow the ringing at the rising edge observed to receive a further speed increase advantage due to a multiplier effect of suppressing and speed increase advantage.

Figure 4:
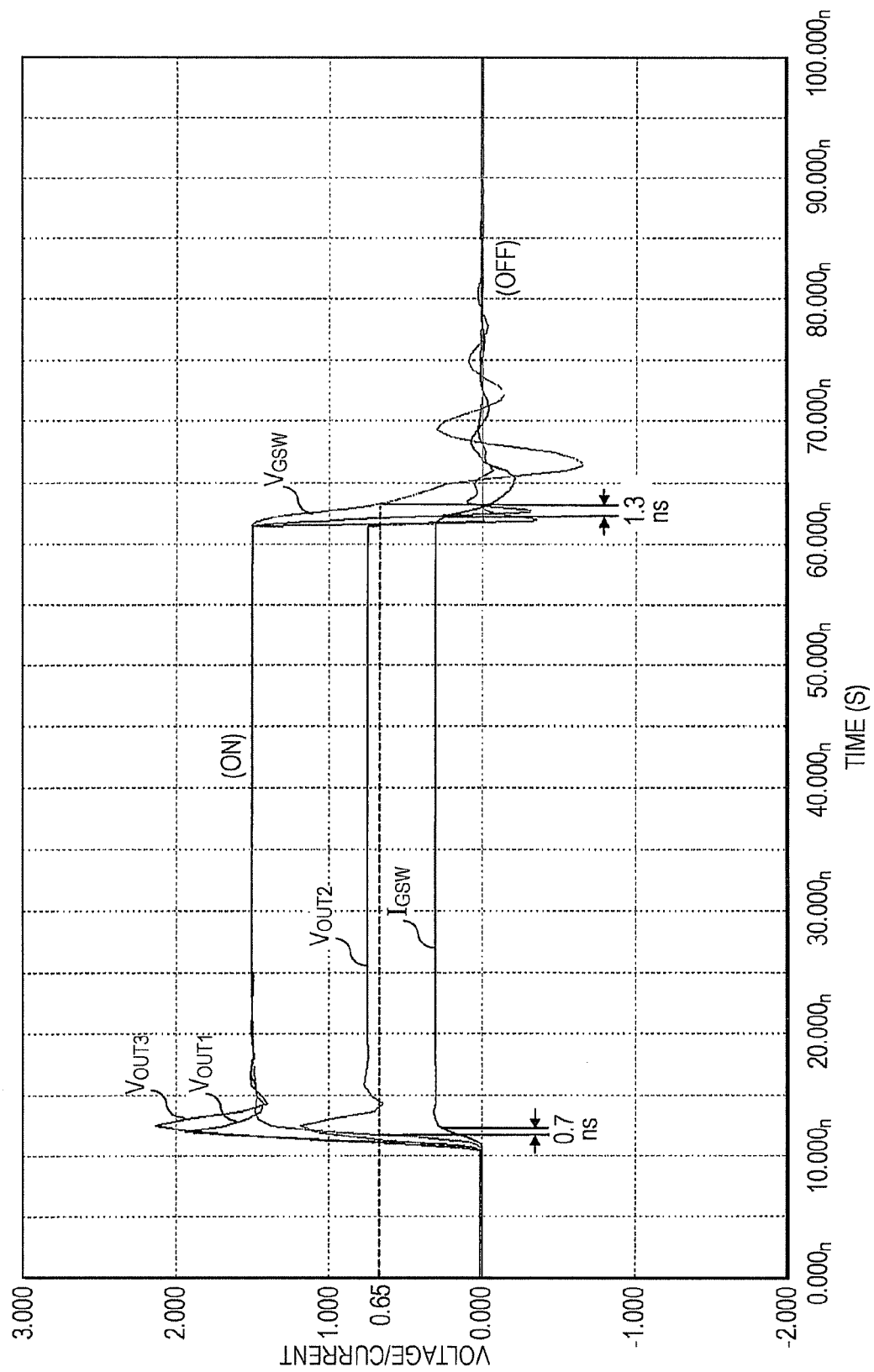
FIG. 4 is a graph illustrating operation waveforms of an embodiment.

FIG. 4 illustrates the operation waveforms during a gate switching operation of the SOA gate switch GSW according to an embodiment. As illustrated in FIG. 4, the inductor L3 gives further emphasis to the rising edge waveform of the voltage $V_{OUT2}$. The provides an advantage of a further increase in bandwidth and speed of the operational amplifier OP4, thereby giving further emphasis to the rising edge waveform of the output voltage $V_{OUT3}$ of the operational amplifier OP4.

Hence, the rising and falling edge waveforms of the input voltage $V_{GSW}$ are steep as can be seen from FIG. 4, the ringing time is reduced from 1.3 ns in the above described embodiment to 0.7 ns in this embodiment B, and both the rising edge and falling edge waveforms of the current $I_{GSW}$ that flows in the SOA gate switch GSW are steep.

Figure 5:
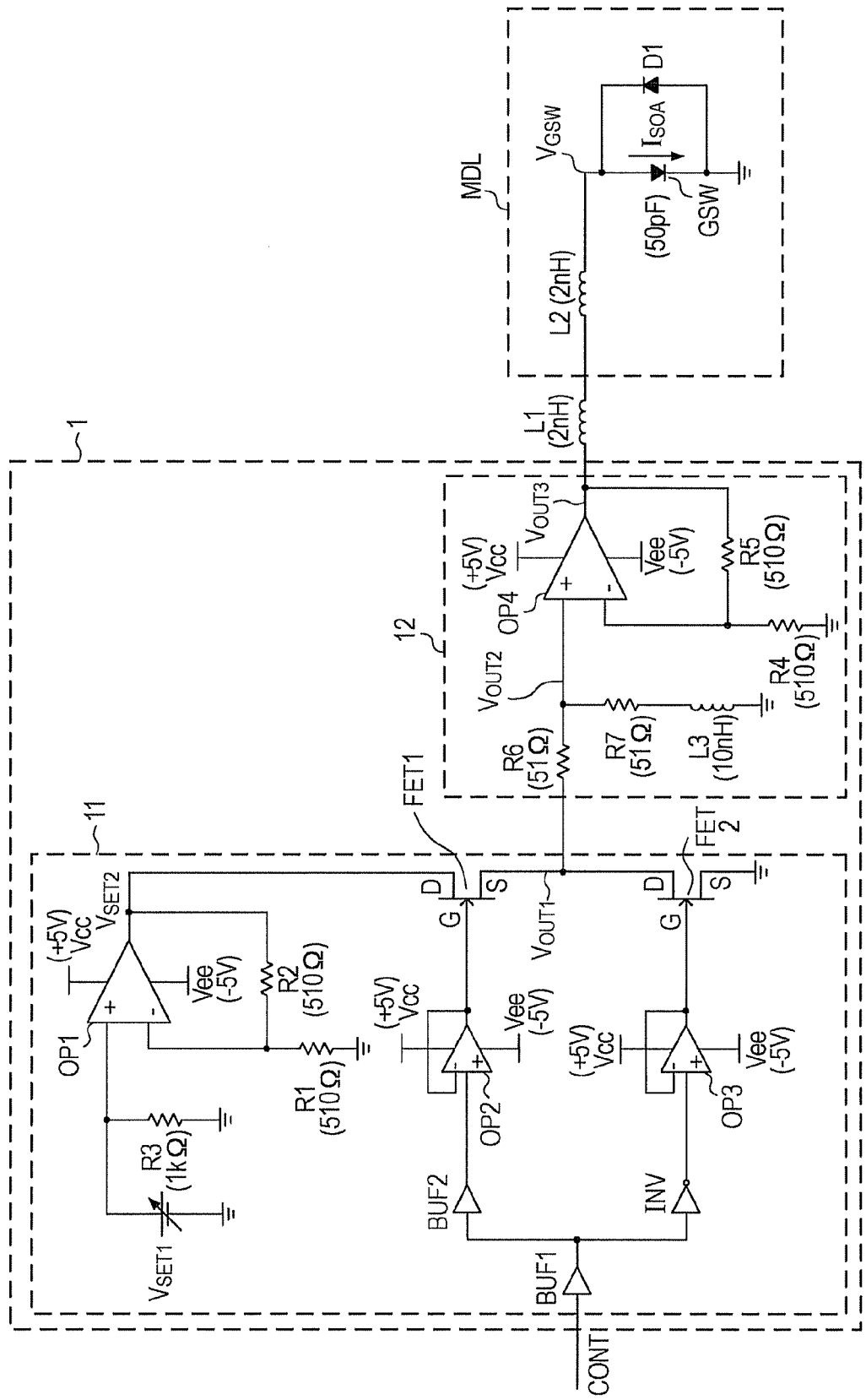
FIG. 5 is a circuit diagram illustrating an embodiment of an SOA gate switch and a drive circuit.
Figure 6:
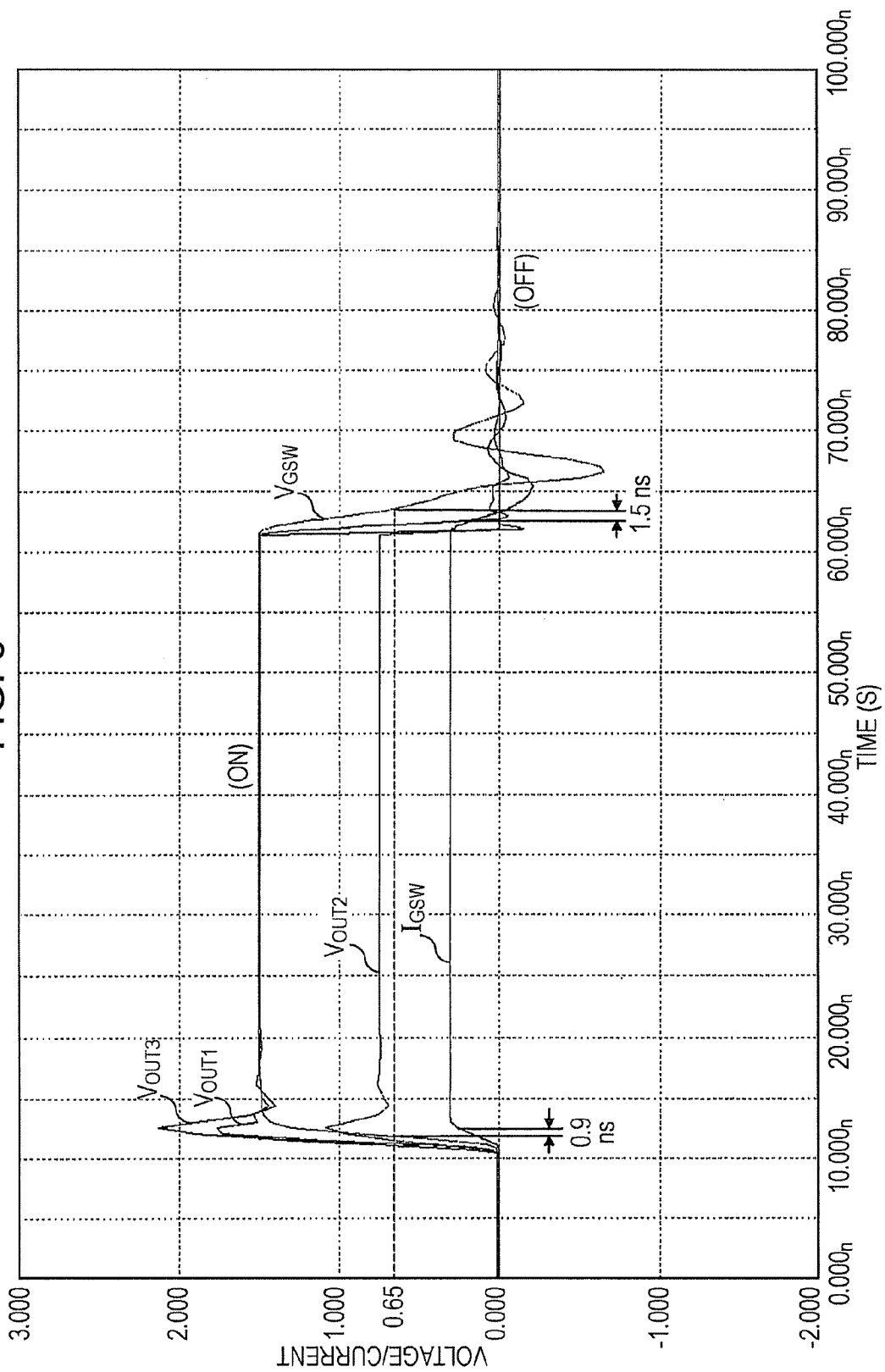
FIG. 6 is a graph illustrating operation waveforms of an embodiment.

FIG. 5 illustrates an embodiment, where the inductor L3 has an inductance of 10 nH, and FIG. 6 illustrates its operation waveforms.

Referring to FIG. 6, it can be seen that the ringing time is 0.9 ns for L3 inductance=10 nH, illustrating that the inductor L3 having a larger inductance is more appropriate for increasing the bandwidth and speed.

Figure 7:
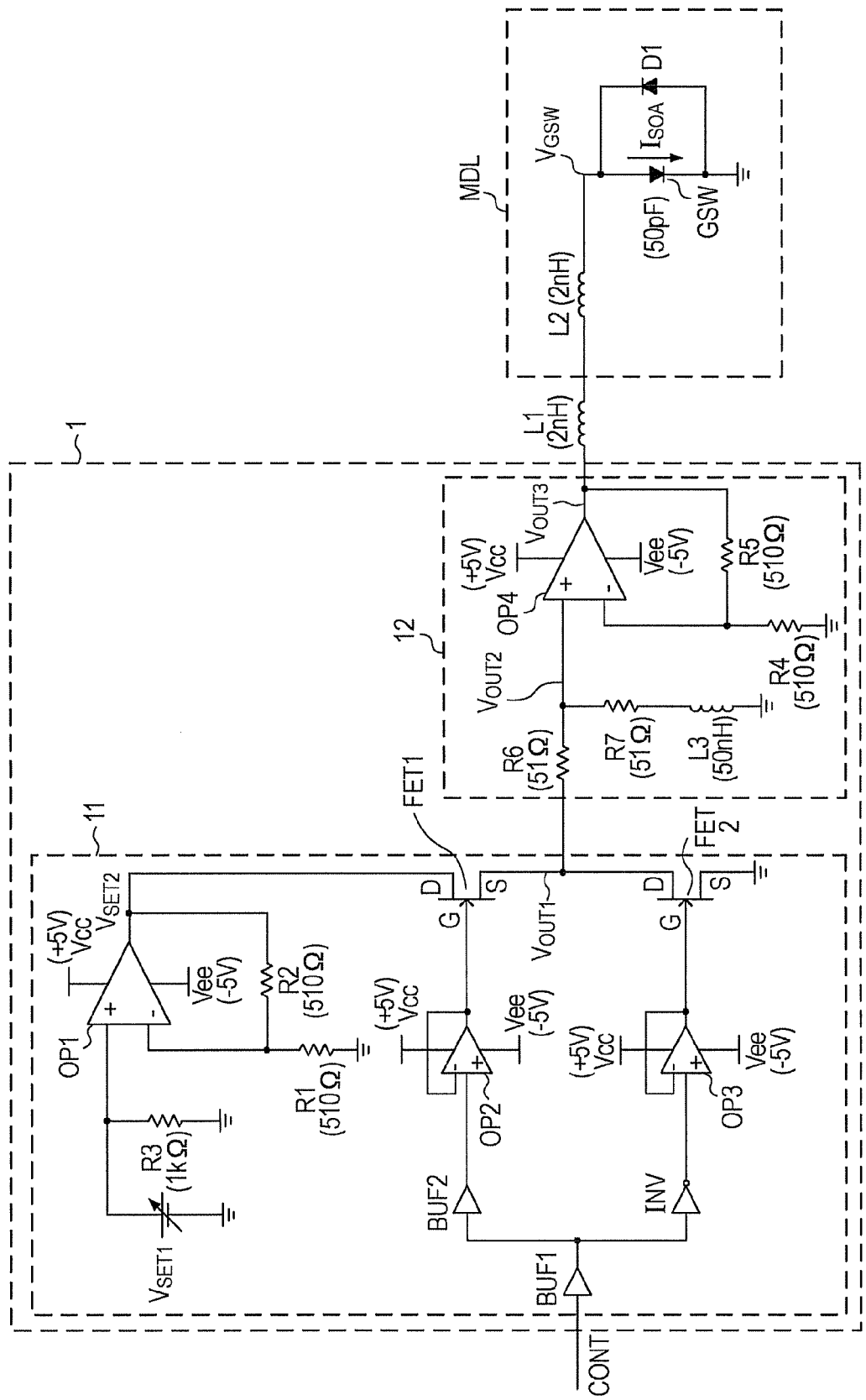
FIG. 7 is a circuit diagram illustrating an embodiment of an SOA gate switch and a drive circuit.
Figure 8:
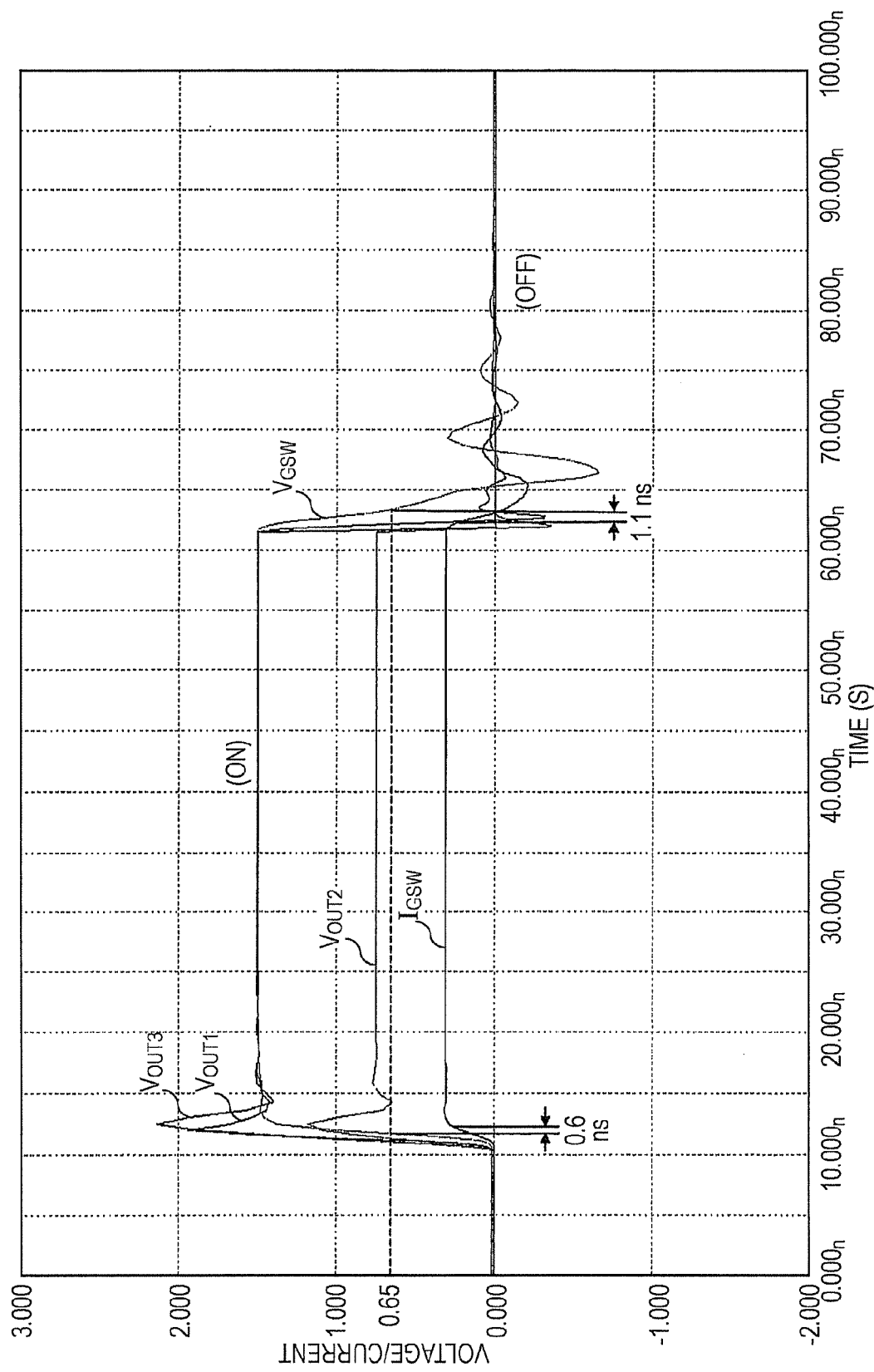
FIG. 8 is a graph illustrating operation waveforms of an embodiment.
Figure 9C:
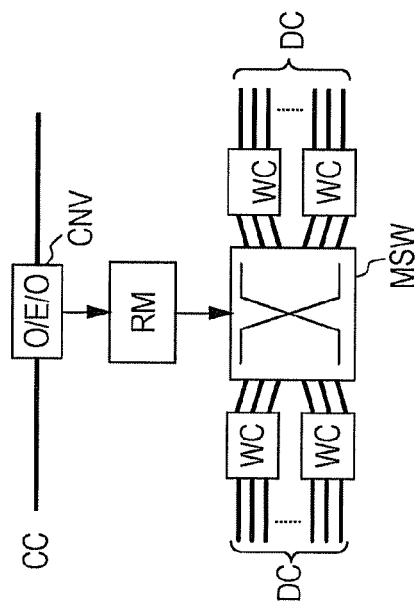
FIGS. 9A, 9B, and 9C are schematic diagrams illustrating a general optical packet switching network.
Figure 9A:
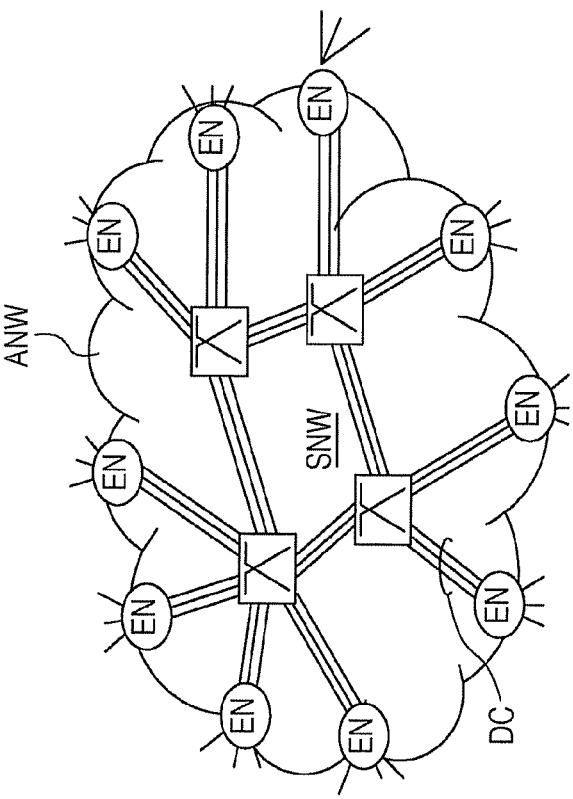
Figure 9B:
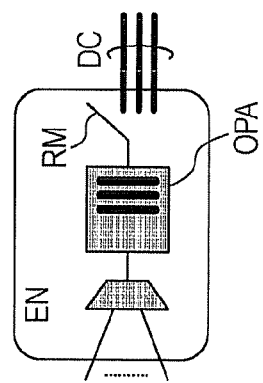
Figure 11:
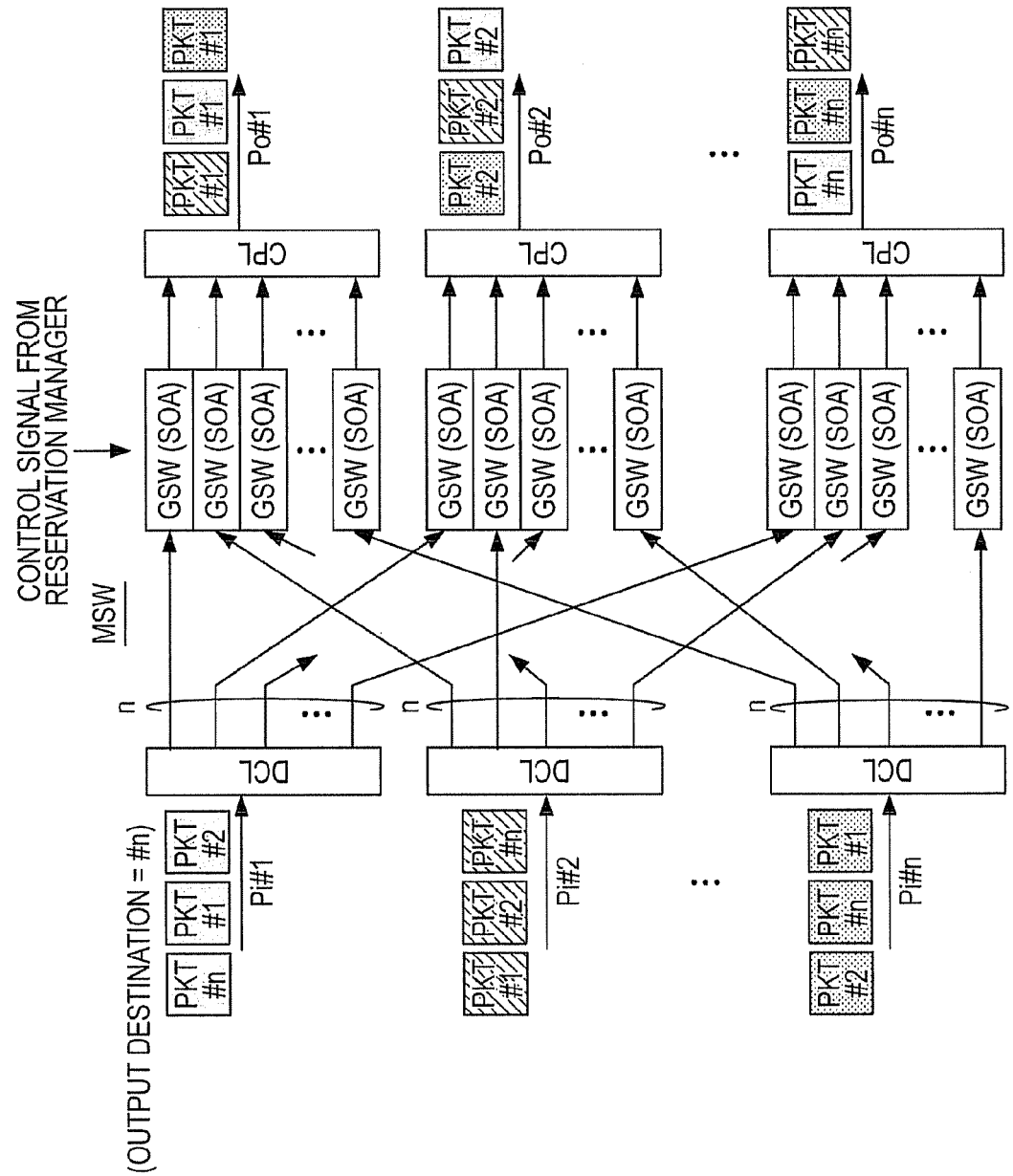
FIG. 11 is a schematic diagram illustrating a general configuration of a matrix optical switch using SOA gate switches.
Figure 12:
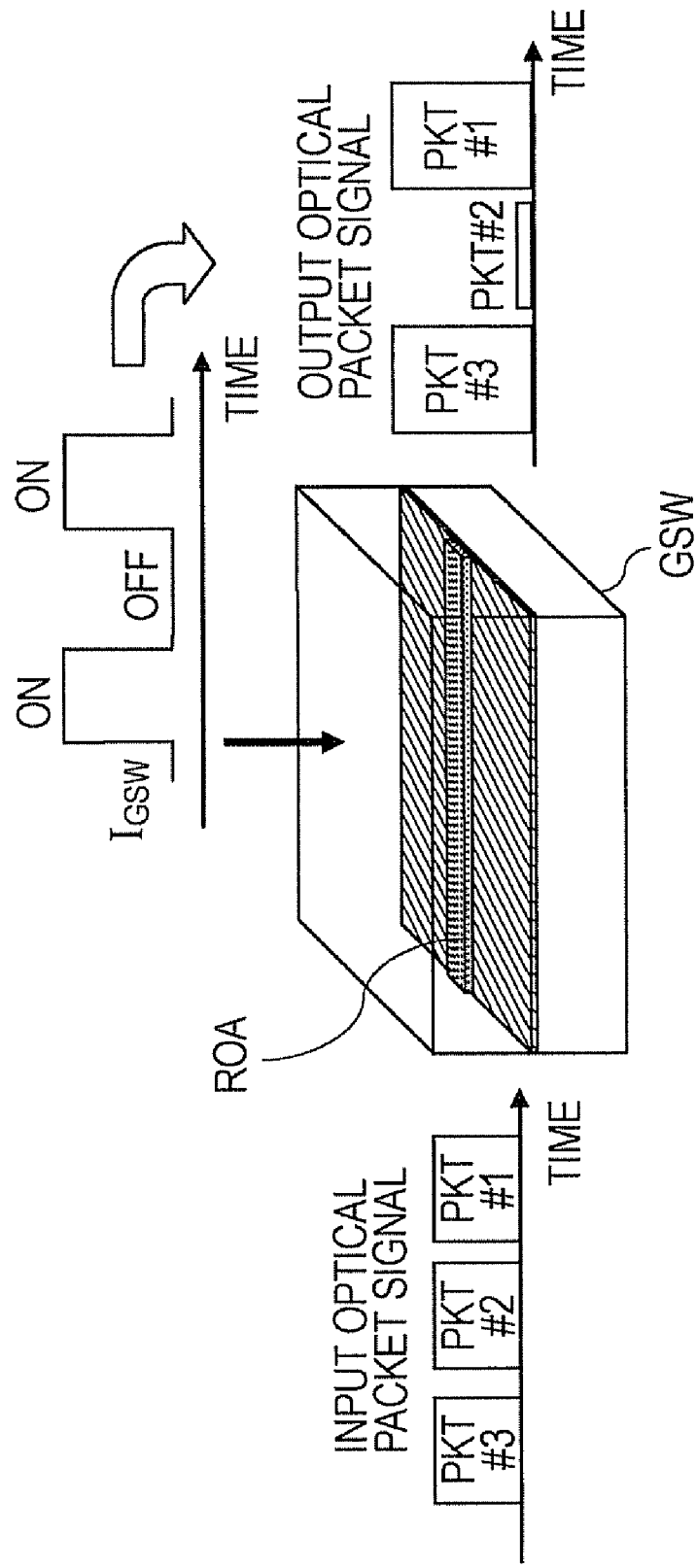
FIG. 12 is a schematic diagram illustrating an operation of an SOA gate switch.
Figure 13:
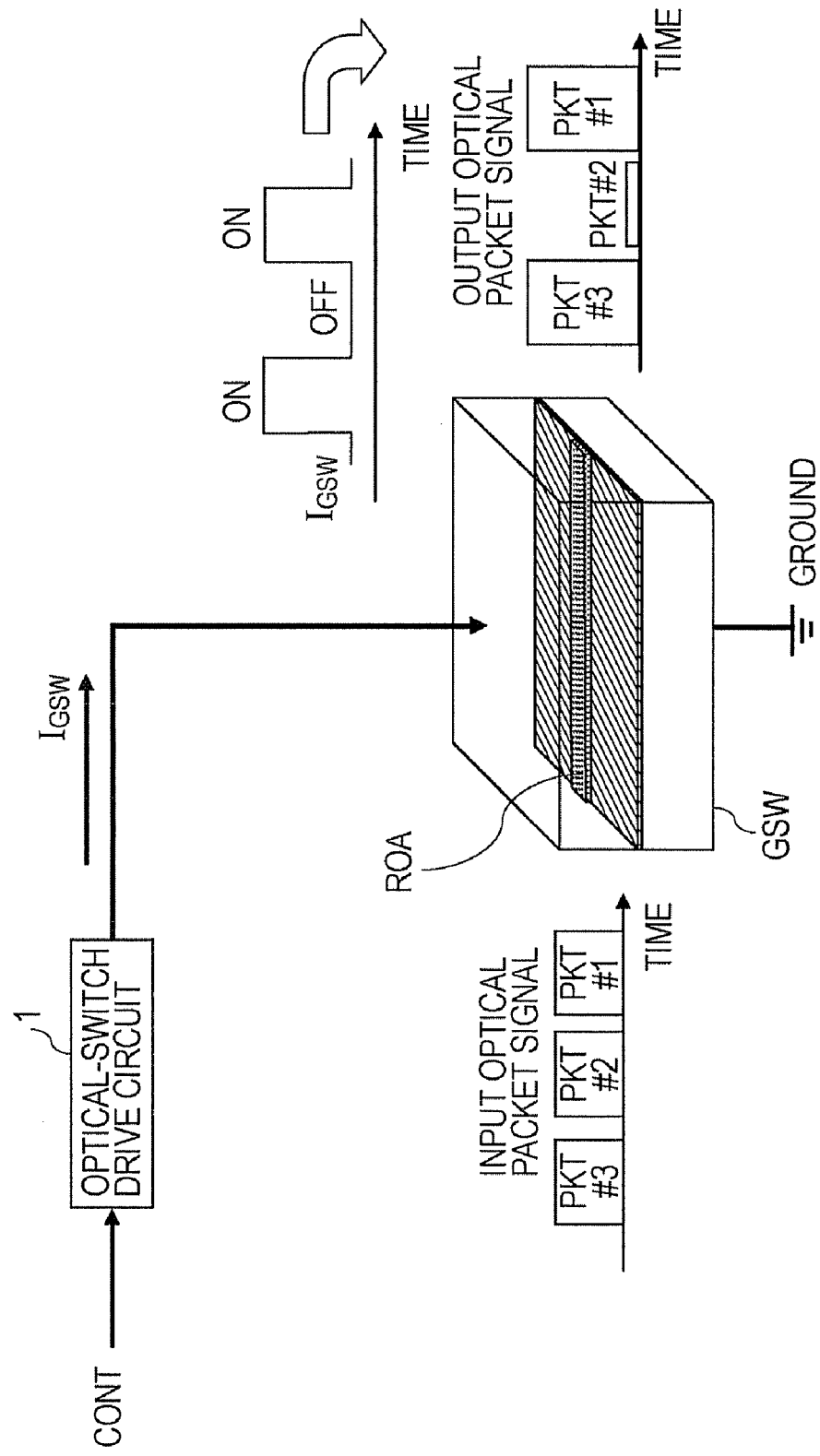
FIG. 13 is a schematic diagram illustrating a configuration for driving an SOA gate switch.
Figure 14:
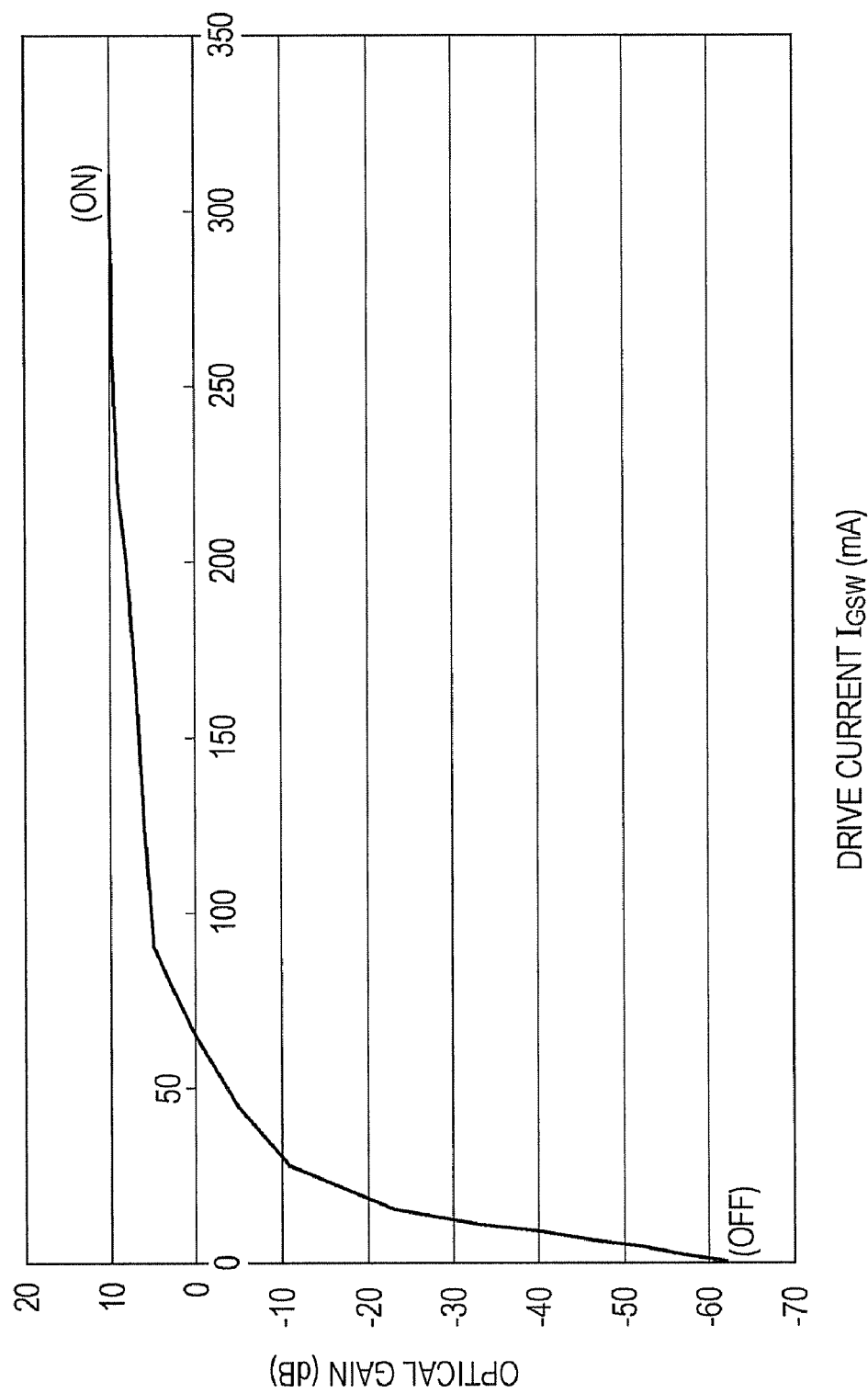
FIG. 14 is a graph illustrating optical gain versus drive current for an SOA gate switch.
Figure 15:
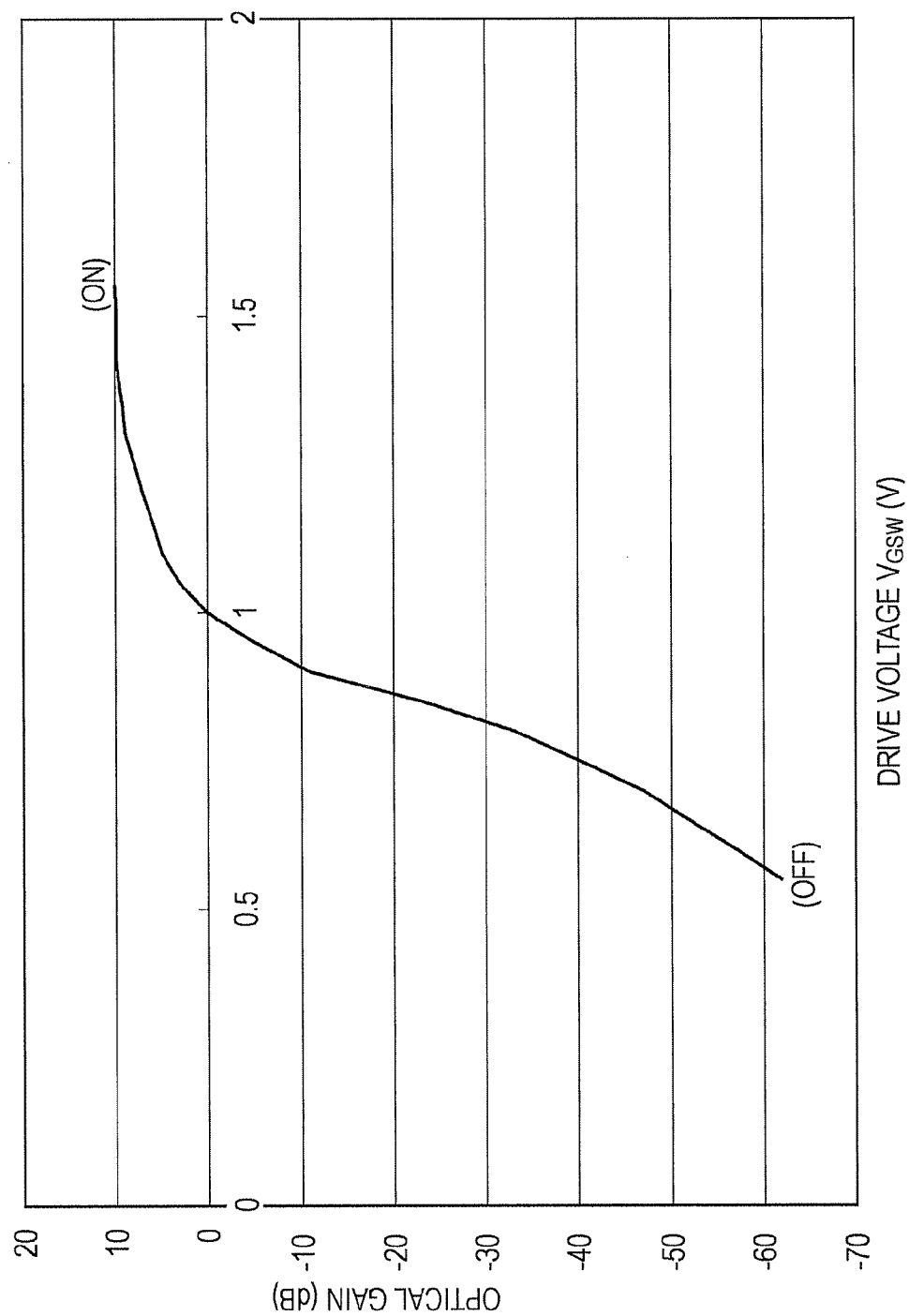
FIG. 15 is a graph illustrating optical gain versus drive voltage for an SOA gate switch.
Figure 16:
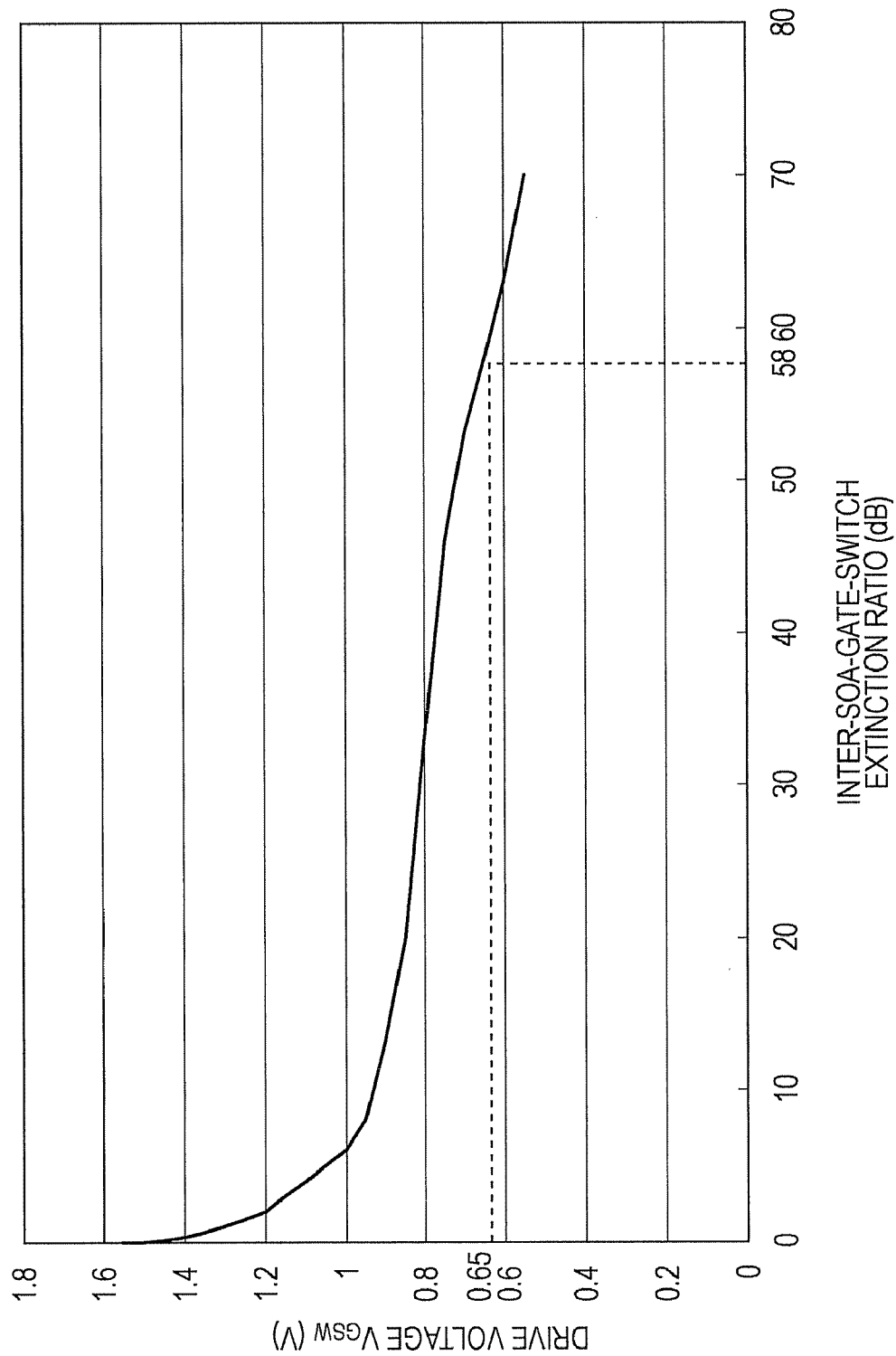
FIG. 16 is a graph illustrating the drive voltage of an SOA gate switch versus the inter-SOA-gate-switch extinction ratio (on/off ratio)

FIG. 7 illustrates an embodiment C, where the inductor L3 has an inductance of 50 nH, and FIG. 8 illustrates its operation waveforms. Referring to FIG. 8, the ringing time for L3 inductance=50 nH is 0.6 ns.

Hence, it can be seen that as the inductance of the inductor L3 increases, the speed and bandwidth advantageously increase.

As has been described above, in the embodiments, an on/off signal output from a high-speed driver unit is provided to a high-speed buffer unit having high impedance. This allows an on-signal to rise at a slew rate higher than in a typical technology because of a reflection of the on-signal due to the high impedance, and therefore, the emphasized waveform of the on/off signal provides an advantage of increasing the speed and bandwidth (instantaneously, 1 GHz to several GHz) of the high speed buffer in the subsequent stage.

The output of the high-speed buffer is supplied to an SOA gate switch through a parasitic inductance of a transmission line of a substrate pattern and a parasitic inductance of a transmission line within the SOA gate switch module.

Hence, the output of the high-speed buffer used for driving the SOA gate switch will have a preemphasized signal waveform and will have a pulse width that is smaller than the time constant (approximately 3 ns) determined by the parasitic inductance of the SOA gate switch and the parasitic capacitance of the SOA gate switch itself, resulting in an increased switching speed of a gate switch current. Thus, suppression of ringing at the rising portion and increased speed of the optical switch are realized.

The embodiments described above realize various advantages including the following functions, among others.

(1) Ringing during a rising period is suppressed.
(2) A switching speed of a semiconductor optical amplifier is increased.
(3) Speed and bandwidth of an SOA driver amplifier are increased.
(4) A drain-source current capacity is decreased.
(5) FET devices are decreased in size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention, the scope of which is defined in the claims and their equivalents.

What is claimed is:

1. An optical-switch drive circuit comprising:
   a driver circuit that generates an on/off signal for driving a semiconductor optical amplifier gate switch in response to a control signal and can output the on/off signal with a high-current operation; and
   an operational amplifier that has a high input impedance than an input impedance of the semiconductor optical amplifier gate switch for receiving the on/off signal output from the driver circuit, is electronically coupled between an output terminal outputting the on/off signal and the semiconductor optical amplifier gate switch and provides the on/off signal with semiconductor optical amplifier gate switch by a high-current operation, and
   the operational amplifier includes a high-resistance voltage divider that is coupled with the output terminal, and
   wherein the high-resistance voltage divider has an inductor and a resistor of a lower-potential side, the inductor being serially coupled with the resistor of the lower-potential side.

* * * * *

UNITED STATES PATENT AND TRADEMARK OFFICE
CERTIFICATE OF CORRECTION

PATENT NO. : 8,179,593 B2  
APPLICATION NO. : 12/406624  
DATED : May 15, 2012  
INVENTOR(S) : Masaji Noguchi et al.

It is certified that error appears in the above-identified patent and that said Letters Patent is hereby corrected as shown below:

First Page Column 1, Under

(56) References Cited

U.S. PATENT DOCUMENTS insert -- 6,724,376 B2   4/2004 Sakura --.

Signed and Sealed this
Thirty-first Day of July, 2012

David J. Kappos
*Director of the United States Patent and Trademark Office*